US008030158B2

(12) United States Patent
Kang et al.

(10) Patent No.: US 8,030,158 B2
(45) Date of Patent: Oct. 4, 2011

(54) METHOD FOR FABRICATING CONTACTS IN SEMICONDUCTOR DEVICE

(75) Inventors: Chun Soo Kang, Yongin-si (KR); Jin Hyuck Jeon, Icheon-si (KR)

(73) Assignee: Hynix Semiconductor, Icheon-si (KR)

( * ) Notice: Subject to any disclaimer, the term of this patent is extended or adjusted under 35 U.S.C. 154(b) by 0 days.

(21) Appl. No.: 12/624,278

(22) Filed: Nov. 23, 2009

(65) Prior Publication Data

US 2010/0330791 A1 Dec. 30, 2010

(30) Foreign Application Priority Data

Jun. 29, 2009 (KR) ........................ 10-2009-0058545

(51) Int. Cl.
*H01L 21/8242* (2006.01)
(52) U.S. Cl. ................................ 438/256; 257/E21.658
(58) Field of Classification Search .................. 438/241, 438/256, 397, 399; 257/E21.658
See application file for complete search history.

(56) References Cited

U.S. PATENT DOCUMENTS

| 6,365,928 B1 * | 4/2002 | Yang et al. ..................... 257/296 |
| 2003/0168686 A1 | 9/2003 | Hayashi et al. |
| 2008/0305628 A1 | 12/2008 | Hayashi et al. |
| 2009/0181529 A1 | 7/2009 | Kang et al. |

FOREIGN PATENT DOCUMENTS

| KR | 10-2006-0022573 | 3/2006 |
| KR | 10-2009-0027469 | 3/2009 |

* cited by examiner

*Primary Examiner* — Quoc Hoang
(74) *Attorney, Agent, or Firm* — Marshall, Gerstein & Borun LLP

(57) ABSTRACT

Disclosed is a method for fabricating a contact in a semiconductor device, including: obtaining a pattern layout including bit lines arranged across a cell matrix region of a semiconductor substrate, cell storage node contacts arranged to pass through a portion of a first interlayer insulation layer between the bit lines, and dummy storage node contacts additionally arranged in an end of the arrangement of the cell storage node contacts; and forming the cell storage node contacts and the dummy storage node contacts using the pattern layout.

7 Claims, 6 Drawing Sheets

Best Focus

Defocus 100 nm

Defocus 200 nm

METHOD FOR FABRICATING CONTACTS IN SEMICONDUCTOR DEVICE

CROSS-REFERENCE TO RELATED APPLICATIONS

The present application claims priority to Korean patent application number 10-2009-0058545, filed on Jun. 29, 2009, which is incorporated by reference in its entirety.

BACKGROUND OF THE INVENTION

The present invention relates to a semiconductor device, and more particularly, to a method for fabricating contacts for improving a process margin.

As an integration degree of a semiconductor device is increased, it becomes difficult to form patterns precisely on a wafer or a semiconductor substrate. In a cell matrix region of a memory device such as a Dynamic Random Access Memory (DRAM), regularly repeated cell patterns are patterned, while in an outer cell matrix region, i.e. a peripheral region, the patterns are disposed somewhat irregularly. Accordingly, regularity of the pattern or linearity in a disposition is varied in an edge region or a boundary between the cell matrix region and the peripheral region, and a pattern defect such as a bridge is thus caused in the cell matrix edge and a loss in a process margin is generated as the result.

In a case of a landing plug contact, which is one of multiple contacts and is introduced under a bit line contact and a storage node contact, regularity in disposition is varied as it goes from a cell array to the cell matrix edge. Also, it becomes difficult to ensure a process margin in a storage node contact connected to a capacitor when a critical dimension of a contact hole for the storage node contact is formed the same as that of a storage node contact disposed in the cell array. It can be considered to form the critical dimension of the contact hole for the storage node contact adjacent to the cell matrix edge to relatively large, but in this case a self aligned contact margin with a bit line under the storage node contact can be reduced. Accordingly, a self aligned contact failure such as a short between the bit line and the storage node contact can occur. Also, when considering that a hard mask of a gate or a capping layer thereunder is lost by chemical mechanical polishing upon formation of the landing plug contact in a self aligned contact process, relative enlargement of the size of the storage node contact can cause a self aligned contact failure such as a short between the storage node contact and the gate.

SUMMARY OF THE INVENTION

In one embodiment, a method for fabricating a contact in a semiconductor device, includes: obtaining a pattern layout including bit lines arranged across a cell matrix region of a semiconductor substrate, cell storage node contacts arranged passing through a portion of a first interlayer insulation layer between the bit lines, and dummy storage node contacts additionally arranged in an end of the arrangement of the cell storage node contacts; and forming the cell storage node contacts and the dummy storage node contacts using the pattern layout.

Preferably, the pattern layout further includes gate lines arranged intersectingly with the bit lines, cell landing plug contacts arranged to pass through a portion of a second interlayer insulation layer between the gate lines, and dummy landing plug contacts arranged in an end of the arrangement of the cell landing plug contacts aligned with the dummy storage node contacts.

Preferably, the pattern layout further includes an arrangement of active regions to which the cell landing plug contact are connected and the active regions are excluded from the dummy landing plug contacts. Preferably, the dummy storage node contact has a critical dimension greater than a critical dimension of the cell storage node contact.

Preferably, the cell storage node contact adjacent to the dummy storage node contact has a critical dimension which is greater than the critical dimension of the inwardly placed other cell storage node contact and equal to the critical dimension of the dummy storage node contact.

In another embodiment, a method for fabricating contacts in a semiconductor device, includes: forming bit lines arranged across a cell matrix region of a semiconductor substrate; forming a first interlayer insulation layer for insulating between the bit lines; forming storage node contact holes passing through the first interlayer insulation layer using a pattern layout of cell storage node contacts arranged between the bit lines and dummy storage node contacts additionally arranged in an end of the arrangement of the cell storage node contacts; and forming the cell storage node contacts and the dummy storage node contacts which fill the storage node contact holes.

Preferably, the method further includes: forming gate lines arranged on the semiconductor substrate intersectingly with the bit lines, forming a second interlayer insulation layer for insulating between the gate lines; and forming cell landing plug contacts arranged to pass through a portion of the second interlayer insulation layer and dummy landing plug contacts arranged in an end of the arrangement of the cell landing plug contacts aligned with the dummy storage node contacts.

Preferably, the cell and dummy storage node contacts are formed in a self aligned contact process using the bit lines as a barrier, and the cell and dummy landing plug contacts are formed in a self aligned contact process using the gate lines as a barrier.

DESCRIPTION OF SPECIFIC EMBODIMENTS

Hereinafter, a method for fabricating contacts in a semiconductor device in accordance with the present invention will be described in detail with reference to the accompanying drawings.

FIGS. 1 through 6 are views illustrating a method for fabricating contacts in a semiconductor device in accordance with an embodiment of the present invention.

Figure 1:
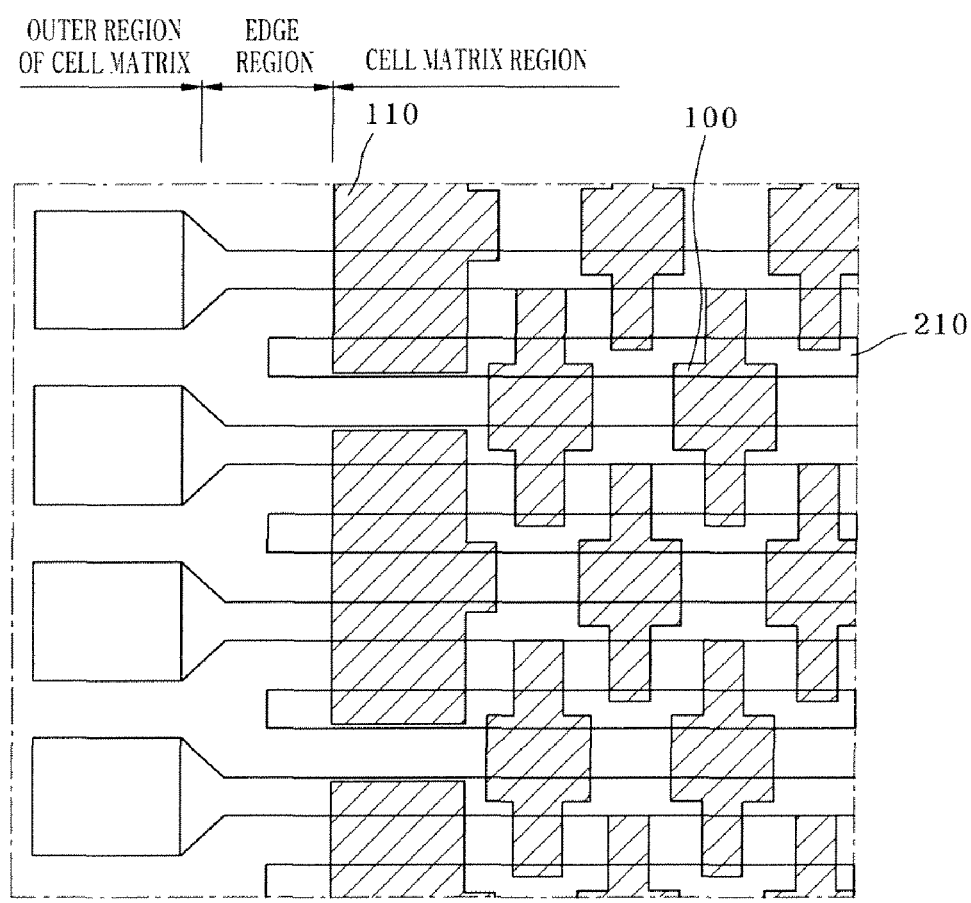
FIGS. 1 through 4 are plan views illustrating a method for fabricating contacts in a semiconductor device in accordance with an embodiment of the present invention.
Figure 5:
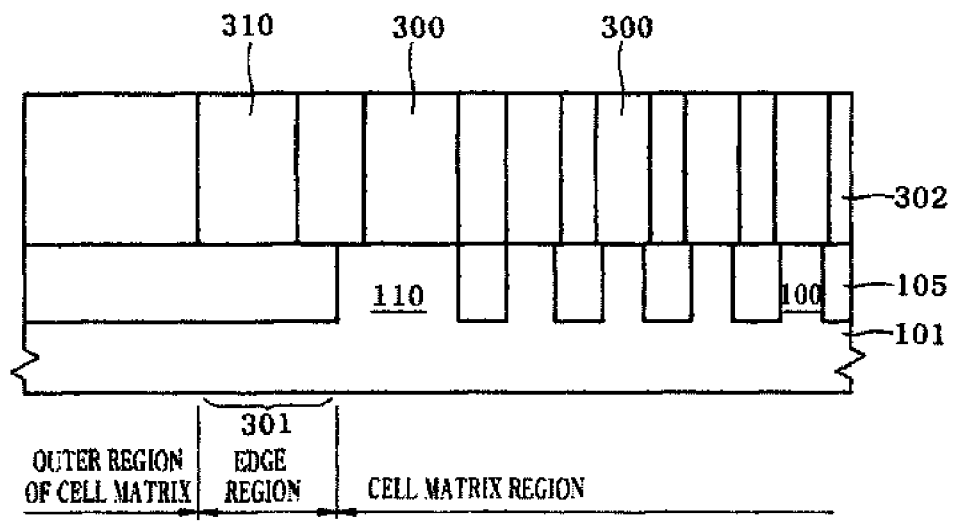
FIGS. 5 and 6 are sectional views illustrating a method for fabricating contacts in a semiconductor device in accordance with an embodiment of the present invention.
Figure 6:
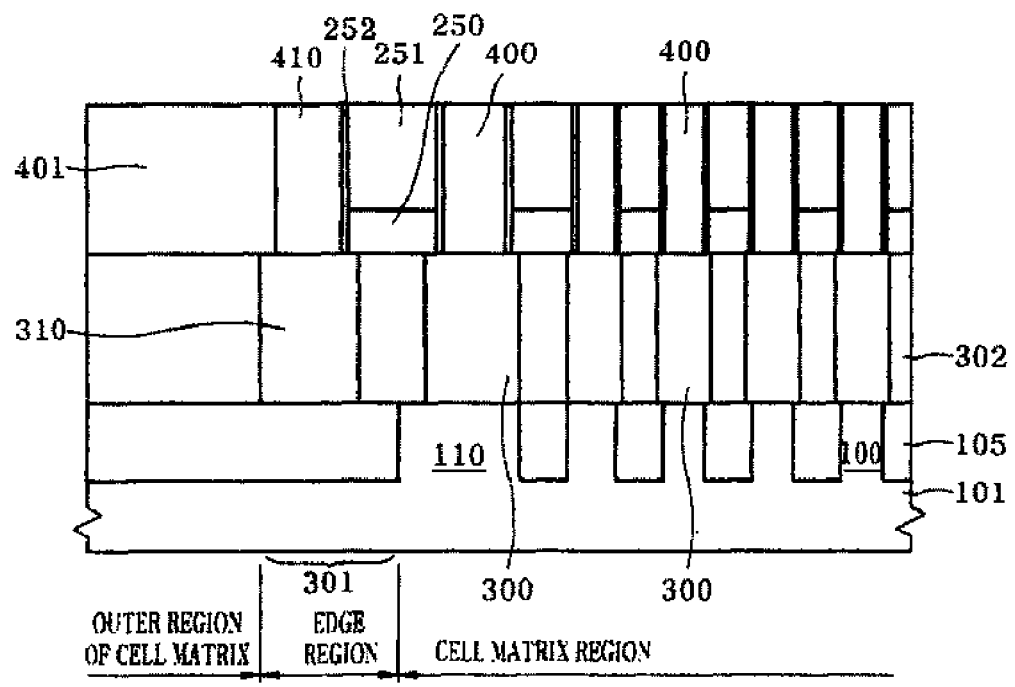

FIG. 1 illustrates a layout in which gate lines 210 are arranged in a cell matrix region. Referring to FIG. 1 together with FIG. 5 illustrating a sectional view of a portion between the gate lines 210 taken along a line X-X', i.e. taken along an extension direction of the gate line 210, active regions 100, 110 are disposed in the cell matrix region and the active region 110 adjacent to an edge region, a boundary between the cell matrix region and the outwardly placed outer cell matrix region (peripheral region), has a larger critical dimension than that of the inwardly placed other active region 100 in order to restrict pattern deformation in a photolithography process due to variation in pattern regularity in the cell matrix edge region. An isolation region 105 (FIG. 5) which sets up these active regions 100, 110 is formed in a shallow trench isolation structure. Gate lines 210 disposed across the cell matrix region are formed across these active regions 100, 110.

Figure 2:
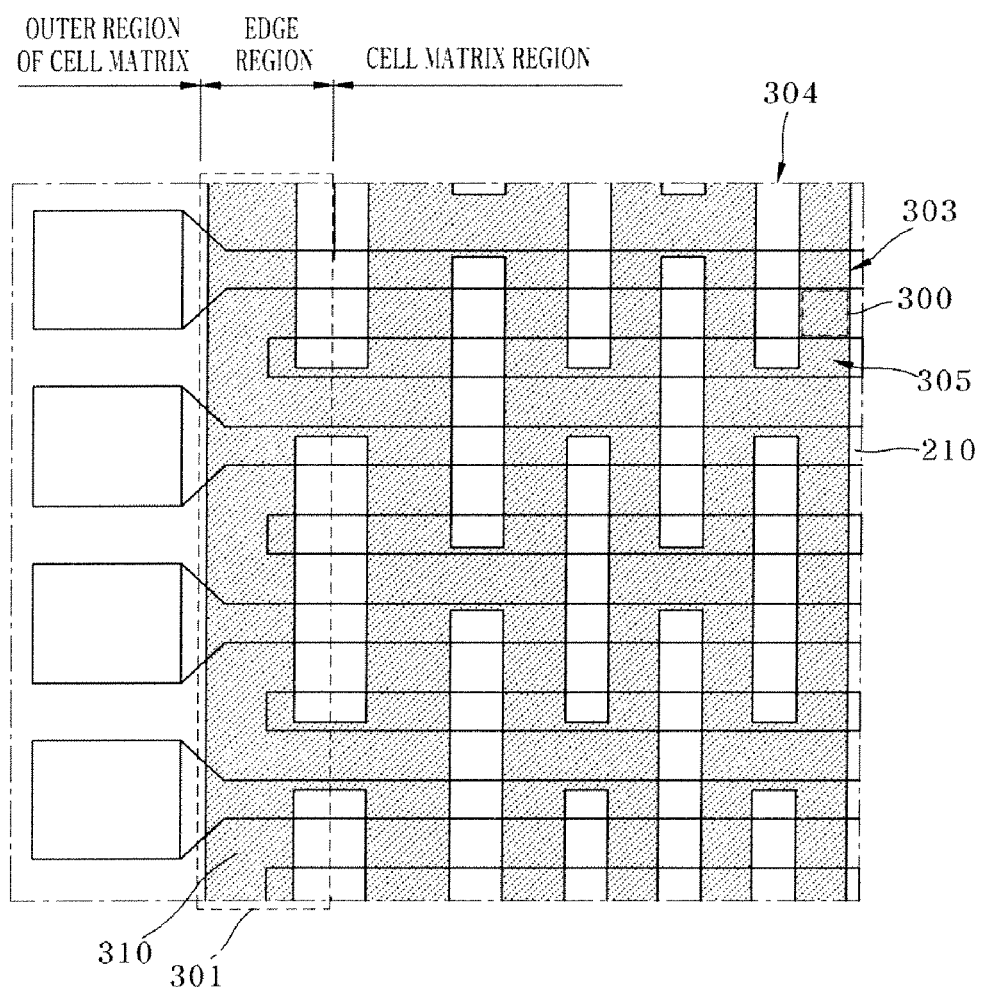

FIG. 2 is a layout illustrating an arrangement of landing plug contacts 300. Referring to FIG. 2 together with FIG. 5, a first interlayer insulation layer 302 which fills and insulates between the gate lines 210 is formed and landing plug contacts 300 which pass through the first interlayer insulation layer 302 and are connected to the active regions 100, 110 under the first interlayer insulation layer 302. At this time, the landing plug contacts 300 are formed in a first self aligned contact process.

For example, a mask 304 having openings 303 which open portions for the landing plug contacts shown in FIG. 2 is formed on the first interlayer insulation layer 302 (FIG. 5) and the portions of the first interlayer insulation layer 302 exposed by the mask 304 are selectively etched to form first self aligned contact holes for the landing plug contacts and a conductive layer, e.g. a polysilicon layer, for filling the first self aligned contact holes is deposited. After that, the polysilicon layer is planarized in a chemical mechanical polishing process using the gates 210 as a barrier to node-separate the polysilicon layer into individual landing plug contacts 300. In order to use the gate 210 as a barrier, a hard mask is introduced as a capping layer on a gate conductive layer which forms the gates 210. By the chemical mechanical polishing process using the hard mask capping layer as a barrier, the portion of the polysilicon layer corresponding to some portion 305 of the opening 303 overlapped on the gate 210 is polished and removed to complete the node-separation.

However, in this first self aligned contact process, a dishing of the first interlayer insulation layer 302 can be caused in the outermost of the cell matrix region, i.e. the edge region 301 during the chemical mechanical polishing process, and this dishing can cause the result that this portion of the first interlayer insulation layer 302 is relatively lowered. By this dishing, the landing plug contact 200 close to the edge region can also be lowered and the hard mask of the gate 210 used as a barrier can also be lowered due to a loss in thickness. This dishing phenomenon can cause a self aligned contact failure in that a storage node contact and the gate 210 are shorted in a subsequent second self aligned contact process for fabricating the storage node contact.

Also, when performing a photolithography process for forming a mask 304 for the landing plug contact in a photoresist pattern, the regularity of the patterns arranged in the cell matrix region with the regularity is broken in the edge region 301, and it is accordingly difficult to pattern the opening 303 adjacent to the edge region 301 into a designed shape. Accordingly, a connection failure due to a pattern defect or an open failure of the first self aligned contact hole can be caused in the landing plug contact 300 adjacent to the edge region 301.

In order to overcome the difficulty in the formation of the landing plug contact 300 in the first self aligned contact process, dummy landing plug contacts 310 are introduced in the edge region 301. By the introduction of the dummy landing plug contacts 310, it is possible to restrict the generation of the dishing in the chemical mechanical polishing process and it is also possible to improve an exposure process margin in the first self aligned contact process to improve a uniformity in the critical dimension of the landing plug contacts 300 adjacent to the edge region 301 too. These dummy landing plug contacts 310 are not connected to the active regions 100, 110 but are connected to the isolation region 105, and are thus floated. These dummy landing plug contacts 310 can be formed with an equal critical dimension to that of the landing plug contact 300 adjacent to the edge region 301. Also, the landing plug contact 300 adjacent to the edge region 301 can be designed so as to have a critical dimension greater than that of the inwardly placed other landing plug contact 300 in order to compensate for the fact that the first self aligned contact holes can be reduced by an influence that patterns are not disposed in the outer cell matrix region during an exposure process for forming the first self aligned contact holes.

Figure 3:
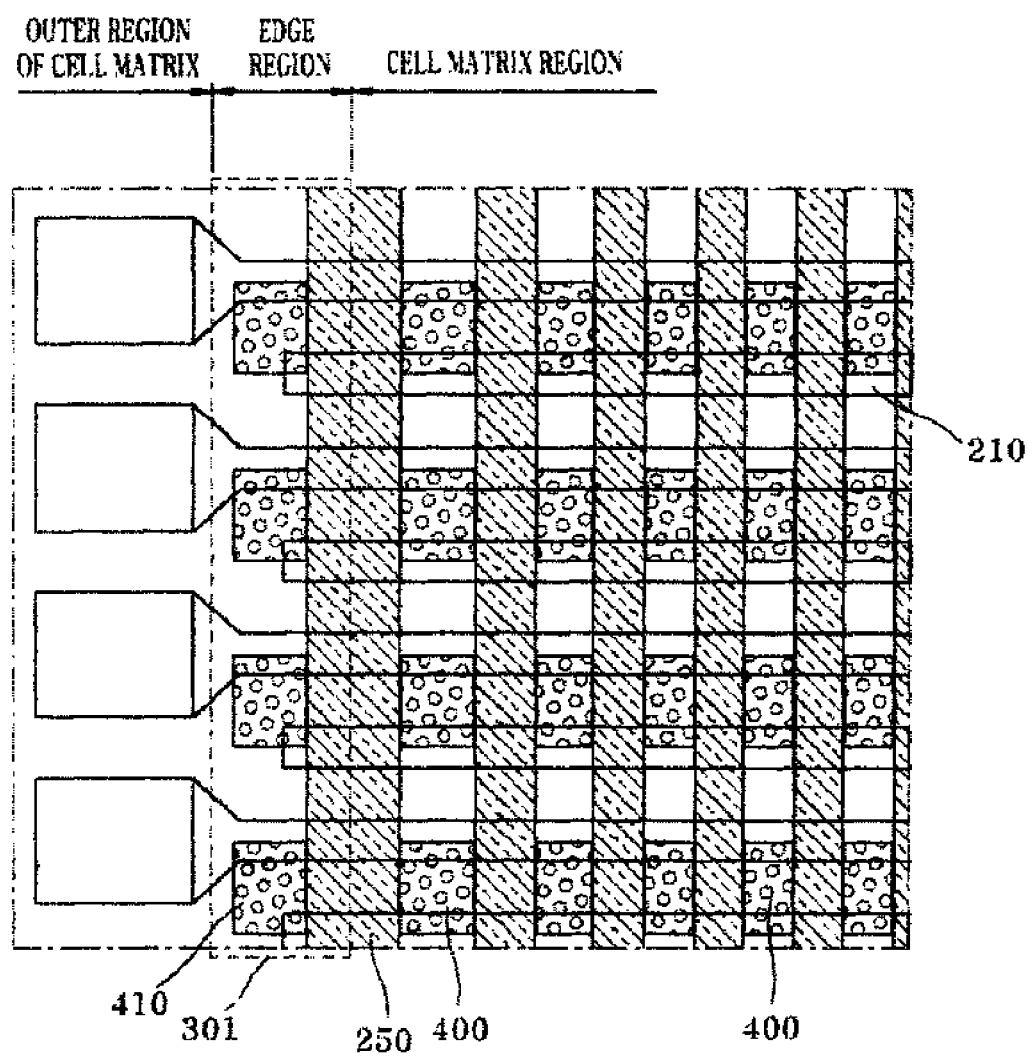
Figure 4:
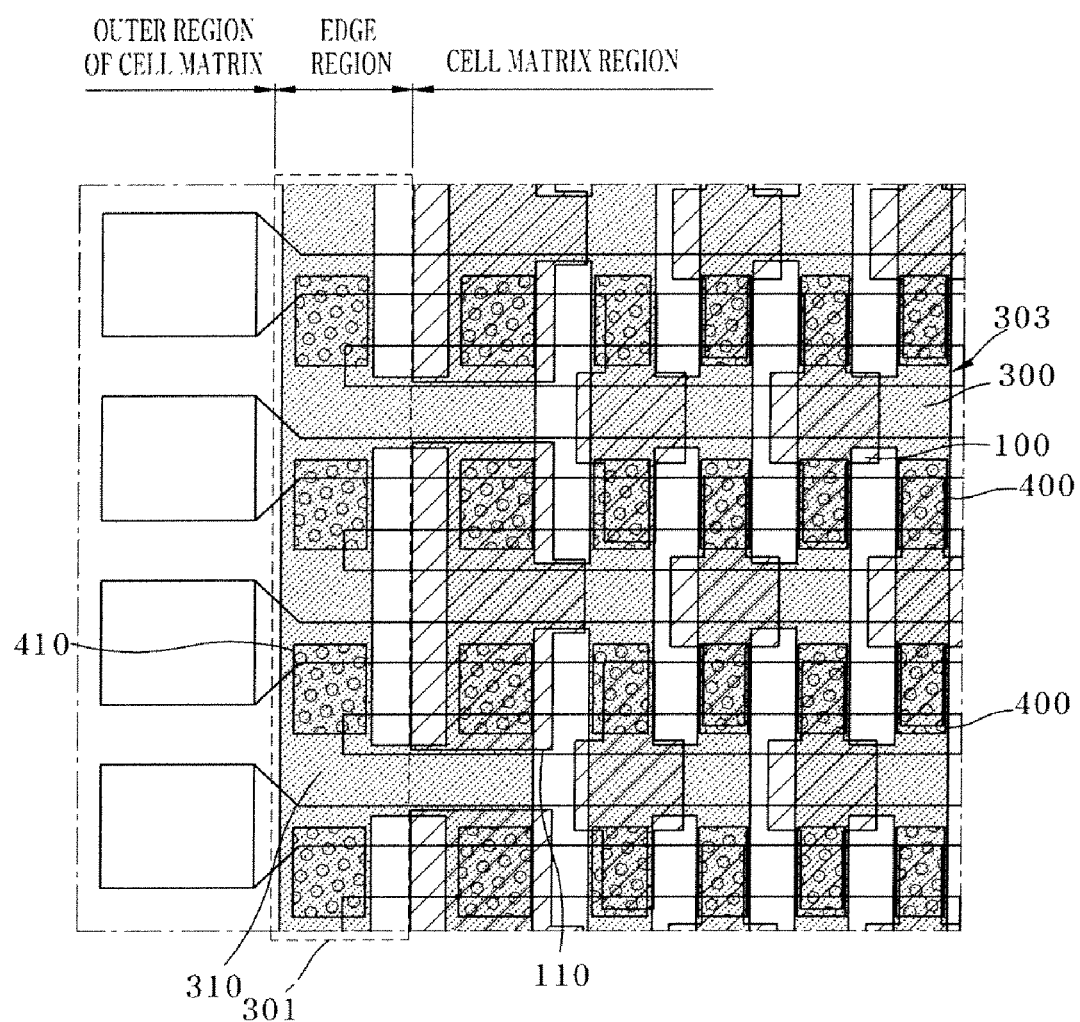

FIGS. 3 and 4 are layouts illustrating an arrangement of the storage node contacts 400. Referring to FIGS. 3 and 4 together with FIG. 6, bit lines 250 are formed intersectingly with the gate lines 210, and a bit line hard mask 251 is formed on the bit lines 250 as a capping layer. Spacers 252 can be further formed on side faces of the bit lines 250. A second interlayer insulation layer 401 which fills and insulates between the bit lines 250 is formed. Storage node contacts 400 which pass through the second interlayer insulation layer 401 and are connected to the landing plug contacts 300 under second interlayer insulation layer 401.

At this time, the storage node contacts 400 are formed in a second self aligned contact process. For example, a mask following a layout of the storage node contacts 400 in FIG. 3 is formed including photoresist patterns on the second interlayer insulation layer 401 using a photolithography process, and the portions of the second interlayer insulation layer 401 exposed by the mask is then selectively etched to form second self aligned contact holes. A conductive layer, e.g. a polysilicon layer, for filling the second self aligned contact holes is deposited. After that, the polysilicon layer is planarized in a chemical mechanical polishing process using the hard mask 251 of the bit lines as a barrier to node-separate the polysilicon layer into individual storage node contacts 400.

However, in this second self aligned contact process, it can cause an open defect in that the second self aligned contact hole for the storage node contact 400 adjacent to the outermost portion of the cell matrix region, i.e. the edge region 301 cannot be formed normally during the exposure process by an influence of rapid variation of the pattern regularity. In order to prevent the defect in the patterning for forming the storage node contact 400, dummy storage node contacts 410 are introduced in the edge region 301. By the introduction of the dummy storage node contacts 410, it is possible to restrict the influence by the rapid variation of the regularity upon the exposure of the second self aligned contact holes for the storage node contact 400 adjacent to the edge region 301 and thus induce the second self aligned contact holes to be opened normally. Since the dummy storage node contacts 410 do not actually function as contacts, it does not matter if the contact hole opening defect is caused.

Figure 7:
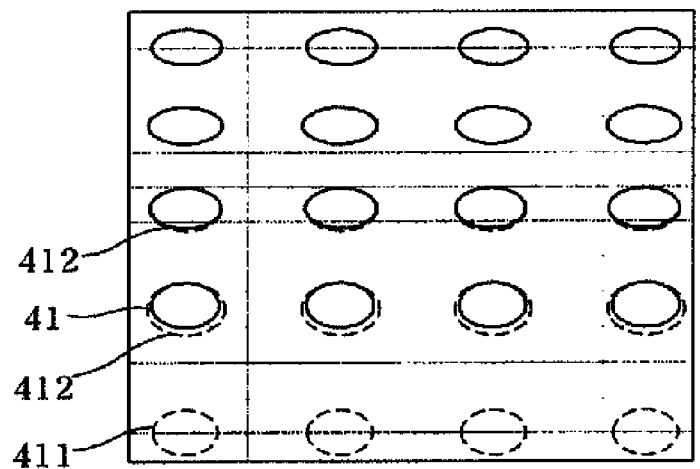
FIG. 7 is a view illustrating an effect by a method for fabricating contacts in a semiconductor device in accordance with an embodiment of the present invention.
Figure 7:
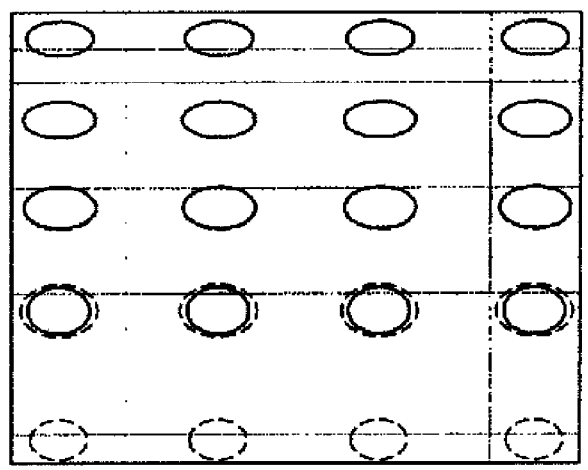
Figure 7:
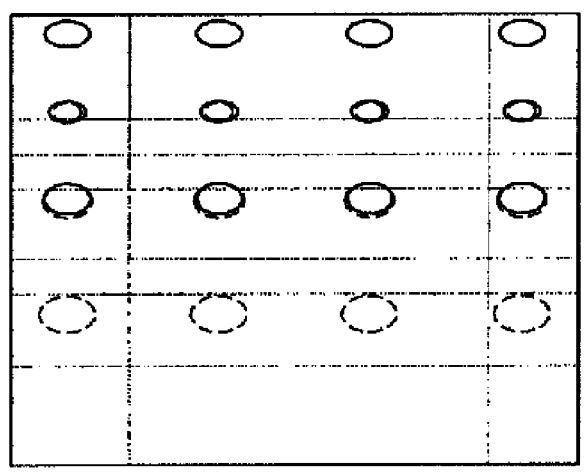

These dummy storage node contacts 410 can be formed with an equal critical dimension to that of the storage node contact 400 adjacent to the edge region 301. Also, the storage node contact 400 adjacent to the edge region 301 can be designed so as to have a critical dimension greater than that of the inwardly placed other storage node contact 400 in order to compensate for the fact that the second self aligned contact holes can be reduced by an influence that patterns are not disposed in the outer cell matrix region during an exposure process for forming the second self aligned contact holes. Nevertheless, the dummy storage node contact 410 can be reduced to a size similar to that of the storage node contact 400 and it is accordingly possible to improve the alignments of the self aligned contact margin with the bit line 250 and the self aligned contact margin with the gate 210. Improvement in depth of focus in the exposure process by the introduction of the dummy storage node contact 410 can be realized as shown in FIG. 7. Referring to FIG. 7, when considering a result of simulation of an exposure process for pattern-transferring the cell layout in which the dummy storage node contact 410 is introduced, it can be found from FIG. 7 that uniformity in a critical dimension of the second self aligned contact hole 412 for the storage node contact 410 adjacent to the second self aligned contact hole 411 by the second self aligned contact hole 411 for the dummy storage node contact 410. It can also be found that the second self aligned contact hole 41 in a case in that the dummy storage node contact 410 is not introduced has considerably reduced critical dimension as compared to the second self aligned contact hole 412 and the critical dimension of the second self aligned contact hole 41 is reduced more as a defocus is increased more as compared to a case of best focus. This result of FIG. 7 shows that it is possible to improve the uniformity in the critical dimension of the storage node contacts 400 and ensure the second self alignment margin more by the introduction of the dummy storage node contact 410.

As described above, embodiments of the present invention can improve the patterning margin of the landing plug contact 300 and also increase the patterning margin of the storage node contact 400 by introducing dummy contacts in a cell matrix edge region. Accordingly, it is possible to prevent self aligned contact failure between the storage node contact 400 and the gate line 210 in the cell matrix edge region and increase the uniformity in the chemical mechanical polishing process introduced in the self aligned contact process in the cell matrix region with restriction of the dishing by the introduction of the dummies 310, 410 in the landing plug contact 300 and the storage node contact 400.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a contact in a semiconductor device, comprising:
    obtaining a pattern layout including bit lines arranged across a cell matrix region of a semiconductor substrate, cell storage node contacts arranged to pass through a portion of a first interlayer insulation layer between the bit lines, and dummy storage node contacts additionally arranged in an end of the arrangement of the cell storage node contacts;
    forming the cell storage node contacts and the dummy storage node contacts using the pattern layout;
    further comprising fabricating the dummy storage node contacts with a critical dimension greater than a critical dimension of the cell storage node contacts; and
    further comprising fabricating the cell storage node contacts adjacent to the dummy storage node contacts with a critical dimension which is greater than the critical dimension of the inwardly placed other cell storage node contacts and equal to the critical dimension of the dummy storage node contacts.

2. The method of claim 1, further comprising intersectingly arranging gate lines with the bit lines, arranging cell landing plug contacts to pass through a portion of a second interlayer insulation layer between the gate lines, and arranging dummy landing plug contacts in an end of the arrangement of the cell landing plug contacts to aligned with the dummy storage node contacts.

3. The method of claim 2, further comprising connecting an arrangement of active regions to the cell landing plug contacts and the excluding active regions from the dummy landing plug contacts.

4. A method for fabricating contacts in a semiconductor device, comprising:
    forming bit lines arranged across a cell matrix region of a semiconductor substrate;
    forming a first interlayer insulation layer for insulating between the bit lines;
    forming storage node contact holes passing through the first interlayer insulation layer using a pattern layout of cell storage node contacts arranged between the bit lines and dummy storage node contacts additionally arranged in an end of the arrangement of the cell storage node contacts;
    forming the cell storage node contacts and the dummy storage node contacts which fill the storage node contact holes;
    further comprising forming the cell and dummy storage node contacts in a self aligned contact process using the bit lines as a barrier, and forming the cell and dummy landing plug contacts in a self aligned contact process using the gate lines as a barrier; and
    further comprising forming the cell storage node contacts adjacent to the dummy storage node contacts with a critical dimension which is greater than the critical dimension of the inwardly placed other cell storage node contacts and equal to the critical dimension of the dummy storage node contacts.

5. The method of claim 4, further comprising: forming gate lines arranged on the semiconductor substrate intersectingly with the bit lines,
    forming a second interlayer insulation layer for insulating between the gate lines; and
    forming cell landing plug contacts arranged passing through a portion of the second interlayer insulation layer and dummy landing plug contacts arranged in an end of the arrangement of the cell landing plug contacts alignedly with the dummy storage node contacts.

6. The method of claim 5, further comprising: forming an isolation region which sets up an arrangement of active regions to which the cell landing plug contacts are connected, wherein the active regions are excluded from the dummy landing plug contacts.

7. The method of claim 4, further comprising forming the dummy storage node contacts with a critical dimension greater than a critical dimension of the cell storage node contacts.

* * * * *